United States Patent [19]

Ito

[11] Patent Number: 4,799,454
[45] Date of Patent: Jan. 24, 1989

[54] APPARATUS FOR FORMING A THIN FILM
[75] Inventor: Hiroki Ito, Amagasaki, Japan
[73] Assignee: Mitsubishi Denki Kabushiki Kaisha, Tokyo, Japan
[21] Appl. No.: 139,748
[22] Filed: Dec. 30, 1987
[30] Foreign Application Priority Data Apr. 27, 1987 [JP] Japan .................. 62-101753

[51] Int. Cl.$^4$ .............. C23C 14/48; C23C 8/36; C23C 16/48
[52] U.S. Cl. .................. 118/723; 118/722; 118/725; 118/50.1; 204/298; 427/38; 427/39; 427/53.1
[58] Field of Search .............. 118/722, 723, 725, 50.1; 204/298; 427/38, 39, 53.1

[56] References Cited

U.S. PATENT DOCUMENTS 4,664,769 5/1987 Cuoma ..................... 204/192.31

OTHER PUBLICATIONS

Takaoka et al., "A1N and A1$_2$O$_3$ Film Formation by the Simultaneous Use of a Microwave Ion Source and an ICB System", Proc. 11th Symp. on ISIAT (1987), Tokyo, pp. 351-356.

Primary Examiner—Richard Bueker
Attorney, Agent, or Firm—Burns, Doane Swecker & Mathis

[57] ABSTRACT

An apparatus for forming a thin film in which the reactive gases, which have been activated by the reactive gas activation means, accelerated by the kinetic energy controlling means, and still more activated by the excimer laser beam emitted toward the neighborhood of the substrate from the excimer laser beam emitting means disposed outside of the vacuum chamber, react with the material to be deposited, which has been clustered or turned into the cluster ion by the ICB device and accelerated, to form a thin film of a compound as the material to be deposited on the substrate disposed within the vacuum chamber maintained at a predetermined degree of vacuum.

15 Claims, 2 Drawing Sheets

APPARATUS FOR FORMING A THIN FILM

BACKGROUND OF THE INVENTION

1. Field of the Invention

This invention relates to an apparatus for forming a thin film, and more particularly to an apparatus for forming a compound thin film in which the compound thin film is deposited on a substrate by means of reactive ionized cluster beam method (R-ICB method).

Description of the Prior Art

Conventionally, a compound thin film such as TiN, $Al_2O_3$, or SiC and the like, is coated on the surface of a substrate by sputtering, chemical vapor deposition (CVD) or the like. In using these apparatuses, however, there were problems in that the thin film coated on the surface of the substrate had insufficient hardness and low adhesive strength with the substrate. For solving these problems, the reactive-ionized cluster beam (R-ICB) method has been develped, in which the thin film is formed by emitting the vapor of a material to be deposited into a reactive gas atmosphere by the use of the cluster ion beam method.

FIG. 1 is a schematic view showing an R-ICB apparatus which is disclosed, for example, in Japanese Patent Publication No. 57-54930 or Proceedings of the International Ion Engineering Congress (ISIAT '83 and IPAT '83). In FIG. 1, an evacuation system 5 evacuates gases in a vacuum chamber 6 and maintains the pressure in the chamber 6 at a predetermined value. A reactive gas supply means 4 for supplying an inside of the vacuum chamber 6 with reactive gases comprises a gas cylinder 41 for supplying reactive gases such as oxygen, nitrogen and hydrocarbon into the chamber 6, a flow regulation valve 42 for regulating the flow rate of the reactive gases which are supplied from the gas cylinder 41 to the chamber 6, and a gas introduction pipe 43 for introducing the reactive gases to a predetermined portion in the chamber 6. A vapor generating means 1 for generating a vapor of a material to be deposited comprises a closed type crucible 12 having a nozzle 11, wherein a material 15 to be deposited is packed, a coiled filament 13 disposed around the crucible 12 for heating the crucible 12 to evaporate the material 15 therein, and a heat shielding plate 14 for shielding the heat of the filament 13. Vapor of the material 15 is emitted out through the nozzle 11 of the crucible 12 to form clusters 16 consisting of a large number of atoms. The clusters 16 formed are ionized by an ionization means 2 which comprises an electron beam emitting means such as a coiled filament 21, an electron beam extraction electrode 22 for extracting electrons from the filament 21 and accelerating them, and a heat shielding plate 23 for shutting out the heat of the filament 21. A first acceleration electrode 3 disposed over the ionization means 2 accelerates the ionized clusters 16a by means of its electrical field, so as to give more kinetic energy to the ionized clusters 16a. Disposed over the first acceleration electrode 3 is a substrate 7 on whose surface a compound thin layer 71 is to be formed. An electric power unit 8 for the vapor generating means 1 is provided on the outside of the chamber 6 and it contains direct current power sources 81, 82 and 83 for giving a bias voltage and power sources 84 and 85 for heating the filaments 13 and 21. Each of the bias power sources in the power unit 8 functions as follows. The first direct current power source 81 biases the potential of the crucible 12 positive in respect to the filament 13 so that thermoelectrons emitted from the filament 13, heated by using the power source 84, collide with the crucible 12. The second direct current power source 82 biases the potential of the filament 21, heated by the power source 85, negative in respect to the electrode 22, thereby drawing the thermoelectrons emitted from the filament 21 into the inside of the electrode 22. The third direct current power source 83 biases the potentials of the electrode 22 and the crucible 12 positive in respect to the first acceleration electrode 3 which is at an earth potential, so as to control the acceleration of the positive charged cluster ions by means of the electrical field lens formed between the electrode 22 and the electrode 22.

The conventional R-ICB apparatus is constructed as mentioned above operates as follows. After evacuating the chamber 6 by the evacuation system 5 to a pressure of around $1 \times 10^{-6}$ mmHg, the reactive gases are introduced into the chamber 6 through the pipe 43 by opening the valve 42. A portion of the reactive gases supplied the inside of the chamber 6 is activated, namely excited or dissociated, at the location above and near the vapor generating means 1. Then, this portion of the reactive gases thus partially activated reaches the surface of the substrate 7.

On the other hand, the crucible 12 is heated by a collision of the electrons emitted from the electrical field generated by the filament 13 to which direct current is applied by means of the power source 81. By heating of the crucible 12, the material 15 in the crucible 12 is vaporized to emit the vapor therefrom through the nozzle 11 into the chamber 6. At this time, the crucible 12 is heated up to a temperature where the vapor pressure of the material 15 in the crucible 12 reaches several mmHg. When the vapor emitted from the crucible 12 passes through the small nozzle 11, the clusters 16 are formed by adiabatic expansion of the vapor due to the pressure differences between the crucible 12 and the chamber 6 under supercooling conditions. The clusters 16 are massive atomic groups formed of condensed 100 to 1000 atoms of the material 15 under the above conditions. A portion of the clusters 16 are then ionized by the electrons emitted from the filament 21 to make the cluster ions 16a. The cluster ions 16a are accelerated by the electrical field generated by the first acceleration electrode 3 to drift toward the substrate 7 along with non-ionized clusters 16. Therefore, the substrate 7 is surrounded by the reactive gases introduced into the chamber 6. Then, the reaction of the cluster ions 16a and clusters 16 with the reactive gases occurs in the vicinity of the substrate 7 to produce compounds. A thin film 71 of the compounds produced are then deposited on the substrate 7.

In the above-mentioned conventional apparatus for the chamber 6 are in a molecular state and the activity thereof is low. Moreover, since the reactive gases activated around the vapor generating means 1 have short activity spans, the activated reactive gases near the substrate 7 are apt to return to a low activity condition. Therefore, the reactivity of the compounds formed by the reaction is low, making the thin film deposited on the substrate 7 unstable. Further, most of the reactive gases are discharged without being used to form the thin film of the compounds.

SUMMARY OF THE INVENTION

The present invention has been achieved in order to solve the problem of the prior art.

It is a first object of the present invention to provide an apparatus for forming a thin film, wherein an excimer laser beam emitting means emits excimer laser beams toward the neighborhood of a substrate, whereby increasing the reactivity of the reactive gases in the vicinity of the substrate, that is, activate the reactive gases, to make a chemical reaction among the reactive gases and a vapour of a material to be deposited, a cluster and a cluster ion progress under the condition that the reactivity is remarkably high, whereby forming a thin film of a compound as the material to be deposited at a still higher deposition speed and high efficiency.

It is a second object of the present invention to provide an apparatus for forming a thin film, wherein a reactive gas activation means in addition to the excimer laser beam emitting means is provided, whereby still more activating the reactive gases to form the thin film of the compound as the material to be deposited at a high deposition speed and high efficiency.

It is a third object of the present invention to provide an apparatus for forming a thin film which is capable of separately controlling a collision speed against the substrate of the reactive gases and the material to be deposited, whereby controlling the quality, such as crystallinity and adhesion, of the thin film.

The above and further objects and features of the invention will more fully be apparent from the following detailed description with accompanying drawings.

BRIEF DESCRIPTION OF THE DRAWINGS

The present invention is more readily apparent from the following detailed description of a preferred embodiment thereof when taken in conjunction with the accompanying drawings, in which.

DESCRIPTION OF THE PREFERRED EMBODIMENT

Figure 1:
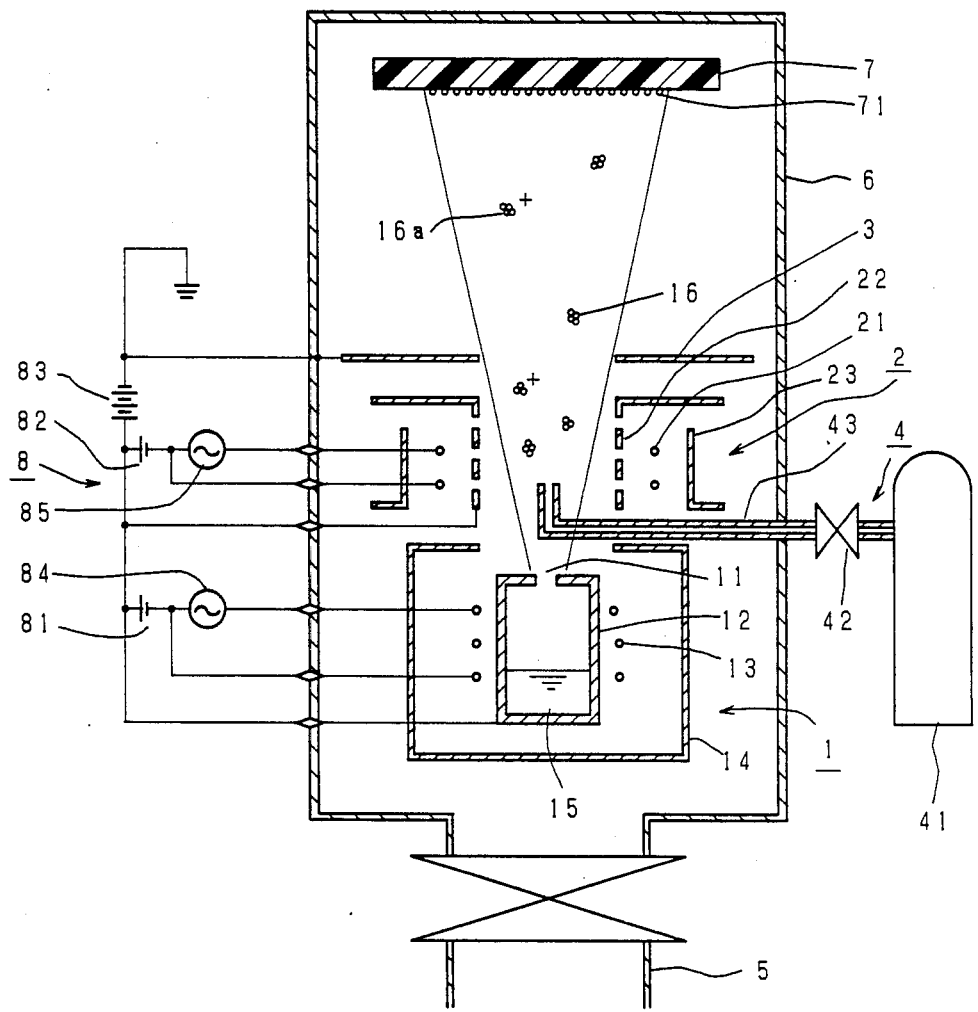
FIG. 1 is a schematic view showing a conventional R-ICB apparatus.
Figure 2:
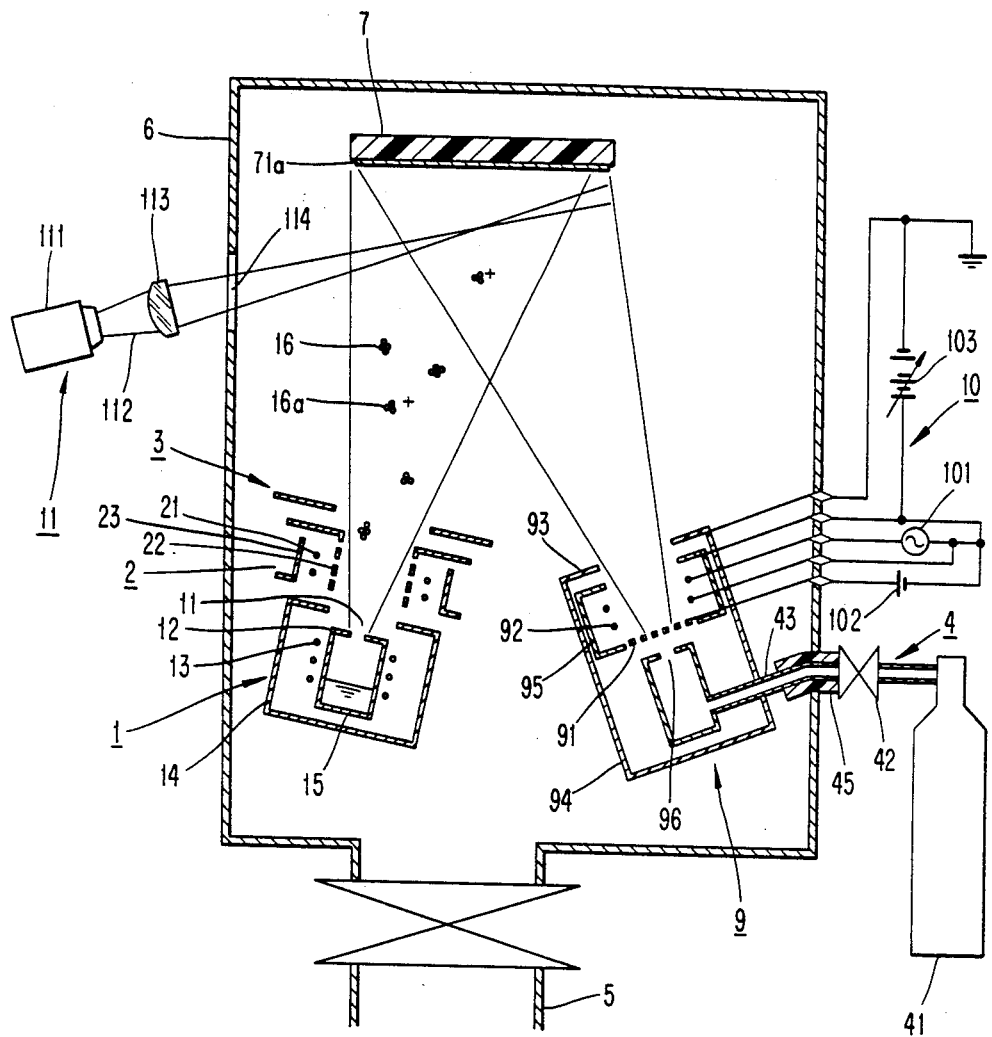
FIG. 2 is a schematic view of an apparatus for forming a thin film on a substrate according to the present invention.

The present invention is described in detail with reference to a presently preferred embodiment thereof as illustrated in FIG. 2. In FIG. 2, the same reference numerals as in FIG. 1 indicate the same or corresponding parts.

In FIG. 2, an internal vessel 94 is disposed in a vacuum chamber 6 in a spaced opposite relation to a substrate 7. A reactive gases activation means 9 for activating, namely exciting, dissociating or ionizing, reactive gases in the vicinity of the substrate 7, comprises an internal vessel 94 and several members within the vessel 94 which will be described in detail later. The reactive gases may be at least one of oxygen, nitrogen and hydrocarbon or may contain elements which produce compounds of a thin film to be deposited on the substrate 7. The reactive gases are introduced into the vacuum chamber 6 through a gas supply means 4 and jetted therefrom into the internal vessel 94 from a gas jet nozzle 96. The gas jet nozzle 96 is connected with the inner end of a pipe 43 which extends through and is hermetically mounted on a side wall of the chamber 6 through an insulating member 45 formed of ceramic. As electron beam emitting means 92 in the form of a filament is disposed around a path of the reactive gases which are jetted from the gas jet nozzle 96. An electron beam extraction means 91 in the form of an electrode is also disposed in and around the path of the jetted reactive gases for extracting the electron beams from the filament 92. By mean of the electrode 91 and the filament 92, the reactive gases are activated with their electron beams. A shielding means 95 in the form of a conductive plate such as a metal plate for shielding potentials of the filament 92 and the electrode 91 is disposed in the internal vessel 94 so as to surround the filament 92 and the electrode 91. A second acceleration electrode 93 for accelerating the jetted reactive gases is disposed on an open end of the internal vessel 94 in the jet direction of the reactive gases. The internal vessel 94 surrounds the above-mentioned members, namely, the filament 92, the electrode 91, the second acceleration electrode 93 and the shielding means 95, and the gas jet nozzle 96 disposed in the internal vessel 94. These members comprise the reactive gases activation means 9.

An electric power unit 10 for the reactive gases activation means 9 is provided on the outside of the chamber 6, which includes a power source 101 for heating the filament 92, a direct current power source 102 for biasing the electrode 91 to a positive potential in respect to the filament 92 and the electrical shielding means 95, and a direct current power source 103 for biasing the electrical shielding means 95 and the electrode 91 to a positive potential in respect to the second acceleration electrode 93.

The excimer laser device 111 for emitting the excimer laser beam is disposed outside of the vacuum chamber 6. Since this excimer laser beam has a short wave length, it is suitable for the activation of the reactive gases.

The excimer laser beam 112 emitted from the excimer laser device 111 is collected by the collection lens 113 and then passed through the window 114, which is disposed on the wall surface of the vacuum chamber 6 and formed of a transparent plate provided with an air-tight sealing member disposed along the periphery thereof, to be emitted toward the neighborhood of the substrate 7. The excimer laser beam emitting means 11 comprises the above described parts.

A vapor generating source 1 for generating vapors and clusters of a material to be deposited, and other members, namely, an ionization means 2 for ionizing the vapors and clusters generated, and a first acceleration electrode 3 for accelerating the ionized vapors and clusters are constructed in the same manner as in FIG. 1 showing a conventional R-ICB apparatus. In the embodiment of the present invention, however, the crucible 12 has one nozzle 11 or several nozzles. An illustration of an electrical power unit 8 for the vapor generating means 1 is omitted in FIG. 2.

In the above-mentioned apparatus for forming a thin film according to the present invention, the pressure in the vacuum chamber 6 is adjusted to be a predetermined degree of vacuum by means of the evacuation system 5. The reactive gases, flow rate of which is regulated by a flow regulating valve 42, are introduced into the chamber 6 through a gas introduction pipe 43. Then, the reactive gases introduced are further guided into the internal vessel 94 from the gas jet nozzle 96, so as to adjust the pressure in the chamber 6 to be at about $10^{-4}$ to $10^{-3}$ mmHg. At this time, the gas pressure in the internal vessel 94 is adjusted to be higher than that of the chamber 6. The filament 92 as the electron beam emitting means, disposed in the electrical field shielding means 95, is heated to a temperature of about 2000° C. by means of the power source 101. The power source 102 biases the electrode 91 to a positive potential in respect to the filament 92 and the shielding means 95, thereby emitting the electron beam from the filament 92 toward the electrode 91, which is disposed downstream of the gas jet nozzle 96. By the application of the bias voltage due to the power source 102, electrons of 1A (ampere) to 5A (amperes) are emitted from the filament 92 toward the reactive gases jetted from the gas jet nozzle 96.

And, the extracted electrons are brought into collision with molecules or atoms of the reactive gases in the vicinity of the gas jet nozzle 96 to lead the reactive gases to the condition that the molecules or atoms are excited until the energy state is higher than the ground state, the molecules are dissociated to the atomic state, or electrons of the molecules or atoms are brought into collision to be lost, whereby being ionized to activate.

In addition, simultaneously, the excimer laser beam 112 from the excimer laser device 111 is emitted toward the neighborhood of the substrate 7 through the collecting lens 113 and the window 114, whereby the reactive gases in the vicinity of the surface of the substrate 7 are excited, dissociated or partially ionized to reach the remarkably activated state by the activating action of the laser beam having a short wave length. In addition, although the activation by the excimer laser beam 112 is possible for both the reactive gases and the cluster 16, a still larger energy is required for the activation of the cluster 16, so that the activation of the reactive gases is mainly brought about.

Since the potential of the filament 92 is identical to that of the shielding means 95, the electron beams thus emitted are confined within the shielding means 95 and are especially concentrated around the path of the reactive gases. Therefore, the reactive gases can be activated efficiently to cover the substrate 7. The ionized reactive gases and the electron beams are accelerated by the second acceleration electrode 93 so as to impinge against the substrate 7. This acceleration can be controlled by varying the voltage applied to the electrode 93. For example, acceleration voltage of 0 to 0.2 KV causes about a $10^{-6}$ A/mm$^2$ electron beam to irradiate the substrate 7 and 0.2 KV to 0.6 KV causes a $10^{-6}$ to $10^{-5}$ A/mm$^2$ ion beam to irradiate the substrate 7.

On the other hand, in the vapor generating means 1, the crucible 12 is heated to a temperature where a vapor pressure of the material 15 to be deposited in the crucible 12 becomes several mmHg, by means of the filament 13 to which AC voltage is applied from the power source 84. In this state, the heated material 15 in the crucible 12 is evaporated, and then emitted through the nozzle 11 to form the clusters 16. A part of the emitted clusters 16 and vapors are then ionized by electrons emitted from the filament 21. The ionized vapors and the ionized clusters 16a are accelerated by an electrical field, which is generated by the first acceleration electrode 3 under the application of 0 to several KV by the power source 83, so as to impinge against the substrate 7 along with the remaining non-ionized vapors and clusters 16.

On the other hand, the reactive gases, which have been excited, dissociated and ionized by the excimer laser beam 112 and the reactive gas activation means 9, exist on the substrate 7 and in the vicinity of the substrate 7 and impinge against the vapour of the material to be deposited 15, the cluster 16 and the cluster ion 16a to make the reaction progress, whereby forming the deposited thin film 71a of compound on the substrate 7. This activation leads to an increased reactivity of the reactive gases and the chemical reaction among the reactive gases, the vapour of the material to be deposited 15, the cluster 16 and the cluster ion 16a makes progress at a remarkably high activity, so that the deposited thin film of compound can be formed at a high deposition speed and high efficiency.

At this time, it is possible to independently control the kinetic energies of the reactive gas ions and the vapor or cluster ions 16a by changing the application voltages to the first and second acceleration electrodes 3 and 93 separately. This makes it possible to control the properties of the compounds, for example crystalline properties such as single crystal, polycrystal, mixed crystal and amorphous, electrical properties, and adhesion to the substrate.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalences of such meets and bounds thereof are therefore intended to be embraced by the claims.

What is claimed is:

1. An apparatus for forming a thin film comprising a vacuum chamber maintained at a predetermined degree of vacuum, an ion cluster beam device for jetting a vapour of a material to be deposited toward a substrate disposed in said vacuum chamber to ionize a cluster of said material to be deposited and accelerate the ionized cluster; and
   a reactive gas supply means for supplying an inside of said vacuum chamber with the reactive gases reacting with said material to be deposited
   for forming a thin film of said material to be deposited on said substrate by a reaction of said material to be deposited with said reactive gases, characterized by that an excimer laser beam emitting means for emitting the excimer laser beam toward the neighborhood of said substrate is provided.

2. An apparatus for forming a thin film as claimed in claim 1, wherein said excimer laser beam emitting means comprises:
   an excimer laser device for emitting the excimer laser beam disposed outside of the vacuum chamber;
   a collecting lens for collecting the excimer laser beam emitted from said excimer laser device and;
   a window disposed on a wall surface of said vacuum chamber for passing the excimer laser beam collected by said collecting lens therethrough.

3. An apparatus for forming a thin film comprising
   a vacuum chamber maintained at a predetermined degree of vacuum;
   an ion cluster beam device for jetting a vapour of a material to be deposited toward a substrate disposed in said vacuum chamber to ionize a cluster of said material to be deposited and accelerate the ionized cluster; and
   a reactive gas supply means for supplying an inside of said vacuum chamber with the reactive gases reacting with said material to be deposited for forming a thin film of said material to be deposited on said material by a reaction of said material to be deposited with said reactive gases, characterized by that a reactive gas activation means for activating said reactive gases and a excimer laser beam emitting means for emitting an excimer laser beam toward the neighborhood of said substrate are provided.

4. An apparatus for forming a thin film as claimed in claim 3, wherein said excimer laser beam emitting means comprises:
- an excimer laser device for emitting the excimer laser beam disposed outside of the vacuum chamber;
- a collecting lens for collecting the excimer laser beam emitted from said excimer laser device; and
- a window disposed on a wall surface of said vacuum chamber for passing the excimer laser beam collected by said collecting lens therethrough.

5. An apparatus for forming a thin film as claimed in claim 3, wherein said reactive gases activation means comprises:
- an internal vessel disposed in said vacuum chamber;
- a gas jet nozzle disposed in said internal vessel for jetting said reactive gases toward said substrate;
- an electron beam emitting means disposed in said internal vessel; and
- an electron beam extracting means for extracting electron beams from said electron beam emitting means in such a manner that the electron beams thus extracted are directed toward said gas jet nozzle and thus irradiated on said reactive gases injected from said gas jet nozzle so as to excite, dissociate and ionize them.

6. An apparatus for forming a thin film as claimed in claim 5, wherein said degree of vacuum in said internal vessel is lower than that in said vacuum chamber.

7. An apparatus for forming a thin film as claimed in claim 5, wherein said electron beam emitting means and said electron beam extracting means are disposed near said gas jet nozzle.

8. An apparatus for forming a thin film as claimed in claim 5, wherein said electron beam emitting means comprises a filament disposed adjacent said gas jet nozzle so as to surround the path of said gas reactive gases jetted from said gas jet nozzle, said filament being connected with an AC power source.

9. An apparatus for forming a thin film as claimed in claim 5, wherein said electron beam extracting means comprises an electrode disposed adjacent said gas jet nozzle, there being a certain voltage applied between said electron beam emitting means and said electrode in such a manner that said electron beam emitting means and said electrode are biased to a negative potential and a positive potential, respectively.

10. An apparatus for forming a thin film as claimed in claim 5, further comprising:
- a shielding means disposed in said internal vessel so as to surround said electron beam emitting means and said electron beam extracting means for shielding the electron beams extracted from said electron beam emitting means toward said electron beam extracting means, the potential thereof being equal to that of said electron beam emitting means.

11. An apparatus for forming a thin film as claimed in claim 5, further comprising a means for controlling the kinetic energy of said reactive gases jetted from said gas jet nozzle toward said substrate.

12. An apparatus for forming a thin film as claimed in claim 10, further comprising a mean for controlling the kinetic energy of said reactive gases jetted from said gas jet nozzle toward said substrate.

13. An apparatus for forming a thin film as claimed in claim 12, wherein said means for controlling the kinetic energy of said reactive gases comprises a means for applying a variable electric field to said reactive gases.

14. An apparatus for forming a thin film as claimed in claim 12, wherein said means for controlling the kinetic energy of said reactive gases comprises:
- a second acceleration electrode disposed in an opened portion of a side of the substrate of the internal vessel.

15. An apparatus for forming a thin film as claimed in claim 14, wherein the potential of said second acceleration electrode is biased to negative in respect to both said electron beam emitting means and electron beam extracting means.

* * * * *